(12) United States Patent
Okamoto et al.

(10) Patent No.: US 7,883,780 B2
(45) Date of Patent: Feb. 8, 2011

(54) LAMINATE OF LIQUID CRYSTALLINE POLYESTER WITH COPPER FOIL

(75) Inventors: Satoshi Okamoto, Tsukuba (JP); Toyonari Ito, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 85 days.

(21) Appl. No.: 11/493,603

(22) Filed: Jul. 27, 2006

(65) Prior Publication Data

US 2007/0026245 A1    Feb. 1, 2007

(30) Foreign Application Priority Data

Jul. 29, 2005   (JP)   ............... 2005-220341
Sep. 14, 2005   (JP)   ............... 2005-266646

(51) Int. Cl.
*B32B 15/09*   (2006.01)
*B32B 15/20*   (2006.01)
*B05D 3/02*   (2006.01)

(52) U.S. Cl. ............... 428/458; 428/457; 428/480; 427/372.2; 427/384; 427/385.5; 427/388.1

(58) Field of Classification Search ............... None
See application file for complete search history.

(56) References Cited

U.S. PATENT DOCUMENTS 6,132,887 A * 10/2000 Clouser et al. ............... 428/606
6,761,834 B2 * 7/2004 St. Lawrence et al. . 252/299.01
6,867,280 B2   3/2005 Okamoto et al.
2004/0210032 A1  10/2004 Okamoto et al.

FOREIGN PATENT DOCUMENTS

| | | |
|---|---|---|
| JP | 2002-143003 | 5/2002 |
| JP | 2002-220444 | 8/2002 |
| JP | 2004-315678 | 11/2004 |
| JP | 2005-219379 | 8/2005 |

OTHER PUBLICATIONS

Ito, Toyonari et al., (2006). "Newly Developed Solvent-Casting Type LCP Film Suitable for PCB Applications". International Conference on Electronics Packing (ICEP), IT-Related Chemicals Research Laboratory, Sumitomo Chemical Co., Ltd., pp. 112-117.

* cited by examiner

*Primary Examiner*—Monique R Jackson
(74) *Attorney, Agent, or Firm*—Foley & Lardner LLP

(57) ABSTRACT

The present invention provides a laminate comprising a resin layer and a copper foil. The resin layer is made from a liquid crystalline polyester having at least one structural unit selected from a structural unit derived from aromatic diamine and a structural unit derived from aromatic amine with a phenolic hydroxyl group in an amount of 10 to 35% by mole on the basis of the total structural units in the polyester. The copper foil has a tensile modulus of 60 GPa or smaller and a tensile strength at break of 150 MPa or smaller measured after heat treatment at a temperature of 300° C. The copper-foil laminate has good flexibility and high durability with little anisotropy is provided.

6 Claims, No Drawings

LAMINATE OF LIQUID CRYSTALLINE POLYESTER WITH COPPER FOIL

BACKGROUND OF THE INVENTION

1. Field of the Invention

The present invention relates to a laminate of a liquid crystalline polyester layer with a copper foil which can be used as, for example, a flexible wiring substrate.

2. Description of the Related Art

A laminate with a copper foil is widely used as a flexible wiring substrate in electronic devices in which high density mounting is required.

Especially, a copper-foil laminate having a liquid crystalline polyester layer as an insulating resin layer attracts attention as a substrate for electronics because of an excellent high frequency characteristic, a low water absorption property and the like due to the properties of liquid crystalline polyester.

In the case that a liquid crystalline polyester layer (or film) to be used in a laminate is produced by an extrusion molding, the layer may be oriented in the direction of the extrusion, and therefore, may have large anisotropy in the longitudinal direction (i.e., the direction to the extrusion) and the transverse direction (i.e., the perpendicular direction to the direction of the extrusion). Such a liquid crystalline polyester layer may have a low mechanical strength in transverse direction compared to that in longitudinal direction, a different adhesion with a copper foil depending on directions, and a different dielectric constant depending on directions, which may make design of a circuit board made from the resulting laminate difficult.

In regard with a liquid crystalline polyester layer, a layer having good properties for a copper-foil laminate has been proposed in which a liquid crystalline polyester solution of a liquid crystal aromatic polyester and an aprotic solvent with no halogen atom is utilized (Japanese Patent Application Laid-Open (JP-A) No. 2004-315678, corresponding to US 2004/0210032 A1).

On the other hand, a flexible copper-foil laminate is also requested so that it may be endured for the use in high frequency. This is because in recent years, many portions of the copper-foil laminate stored in an electronic device may be bent so often, the angle of the bending portions may become small, and the copper-foil laminate is widely used for the places where wiring are needed such as the operating part in a drive member of an electronic device.

SUMMARY OF THE INVENTION

One of the objects of the present invention is to provide a copper-foil laminate having good flexibility and high durability with little anisotropy.

The present inventors have zealously investigated and consequently found a copper-foil laminate with such properties.

The present invention provides a laminate comprising a resin layer and a copper foil, wherein the resin layer is a layer of a liquid crystalline polyester having at least one structural unit selected from the group consisting of a structural unit derived from aromatic diamine and a structural unit derived from aromatic amine with a phenolic hydroxyl group in an amount of 10 to 35% by mole on the basis of the total structural units in the polyester, and the copper foil has a tensile modulus of 60 GPa or smaller and a tensile strength at break of 150 MPa or smaller measured after heat treatment at a temperature of 300° C.

According to the present invention, a copper-foil laminate having good flexibility and high durability with little anisotropy is provided.

DETAILED DESCRIPTION OF THE PREFERRED EMBODIMENTS

A laminate of the present invention comprises a resin layer and a copper foil. The resin layer is made from a liquid crystalline polyester having at least one structural unit selected from the group consisting of a structural unit derived from aromatic diamine and a structural unit derived from aromatic amine with a phenolic hydroxyl group in an amount of 10 to 35% by mole on the basis of the total structural units in the polyester. The copper foil has a tensile modulus of 60 GPa or smaller and a tensile strength at break of 150 MPa or smaller measured after heat treatment at a temperature of 300° C.

The liquid crystalline polyester used in the present invention is a thermotropic liquid crystal polymer, which can form isotropic melt at a temperature of 450° C. or lower. The liquid crystalline polyester contains at least one of structural units selected from a structural unit derived from aromatic diamine and a structural unit derived from aromatic amine with a phenolic hydroxyl group, in an amount of 10 to 35% by mole on the basis of the total structural units in the polyester.

The liquid crystalline polyester in the present invention preferably has the structural units represented by formulas (1), (2) and (3) below, and the amounts of the structural units represented by the formula (1), (2) and (3) are 30 to 80% by mole, 10 to 35% by mole and 10 to 35% by mole on the basis of the total structural units in the polyester, respectively;

  (1)

  (2)

  (3)

where $Ar_1$ indicates phenylene, naphtylene or biphenylene, $Ar_2$ indicates that phenylene, naphthylene, biphenylene, oxybiphenylene or a condensed aromatic ring, $Ar_3$ indicates phenylene or a condensed aromatic ring, X indicates —NH— and Y indicates —O— or —NH—.

Structural unit (1) is a structural unit derived from an aromatic hydroxycarboxylic acid, structural unit (2) is a structural unit derived from an aromatic dicarboxylic acid, and structural unit (3) is a structural unit derived from an aromatic diamine or an aromatic amine having a hydroxyl group. The structural units (1), (2) and (3) can be provided using as raw materials for synthesis, ester-forming derivatives and/or amide-forming derivatives in place of using the aromatic hydroxycarboxylic acid, the aromatic dicarboxylic acid, the aromatic diamine and/or an aromatic amine having a hydroxyl group.

Examples of the ester-forming derivatives of the aromatic hydroxycarboxylic acid, the aromatic dicarboxylic acid for providing a carboxylic group include compounds in which the carboxylic group is converted to a derivative having a high reactivity and promoting a reaction for producing an ester group such as acid chloride, acid anhydride and the like; and compounds in which the carboxylic group forms an ester group with a lower alcohol, ethylene glycol or the like thus being converted to a derivative that forms an ester group by ester-exchange reaction (transesterification).

Examples of the ester-forming derivative of the aromatic hydroxycarboxylic acid and the aromatic amine having a hydroxyl group for providing a phenolic hydroxyl group include compounds in which the phenolic hydroxyl group forms an ester group with a carboxylic acid thus being converted to a derivative that forms an ester group by the ester-exchange reaction (transesterification).

Examples of the amide-forming derivative of the aromatic diamine and the aromatic amine having a hydroxyl group for providing an amide group include compounds in which the amino group forms an amide group with a carboxylic acid thus being converted to a derivative that forms an amide group by condensation reaction.

As described above, the liquid crystalline polyester in the present invention may have the structural units represented by formulas (1), (2) and (3), which are not limited thereto.

Examples of the structural unit represented by formula (1) include structural units derived from p-hydroxybenzoic acid, 2-hydroxy-6-naphthoic acid and 4-hydroxy-4'-biphenylcarboxylic acid, and two kinds or more of the above-mentioned structural units may be contained in the liquid crystalline polyester. Among these structural units, the structural unit derived from 2-hydroxy-6-naphthoic acid is preferably used in the liquid crystalline polyester in the present invention.

On the basis of the total structural units in the polyester, the structural unit (1) is preferably contained in the polyester in the amount of 30 to 80% by mole, more preferably in the amount of 40 to 70% by mole, and most preferably in the amount of 45 to 65% by mole. When the structural unit (1) is in the above-mentioned range, the resulting polyester easily shows liquid crystallinity and also provides a liquid crystalline polyester solution (described later) with an improved solubility in a solvent, which is desirable.

Examples of the structural unit represented by formula (2) include structural units derived from terephthalic acid, isophthalic acid, 2,6-naphthalenedicarboxylic acid and diphenylether-4,4'-dicarboxylic acid, and two kinds or more of the above-mentioned structural units may be contained in the liquid crystalline polyester. Among these structural units, the structural unit derived from isophthalic acid or diphenylether-4,4'-dicarboxylic acid is preferably used in the liquid crystalline polyester in the present invention from the viewpoint of the solubility of the liquid crystalline polyester solution.

On the basis of the total structural units in the polyester, the structural unit (2) is preferably contained in the polyester in the amount of 10 to 35% by mole, more preferably in the amount of 15 to 30% by mole, and most preferably in the amount of 17.5 to 27.5% by mole. When the structural unit (2) is in the above-mentioned range, the resulting polyester easily shows liquid crystallinity and also provides a liquid crystalline polyester solution with an improved solubility in a solvent, which is desirable.

Examples of the structural units represented by formula (3) include structural units derived from 3-aminophenol, 4-aminophenol, 1,4-phenylenediamine and 1,3-phenylenediamine, and two kinds or more of the above-mentioned structural units may be contained in the liquid crystalline polyester. Among these structural units, the structural unit derived from 4-aminophenol is preferably used in the liquid crystalline polyester in the present invention from the viewpoint of the reactivity.

On the basis of the total structural units in the polyester, the structural unit (3) is preferably contained in the polyester in the amount of 10 to 35% by mole, more preferably in the amount of 15 to 30% by mole, and most preferably in the amount of 17.5 to 27.5% by mole. When the structural unit (3) is in the above-mentioned range, the resulting polyester easily shows liquid crystallinity and also provides a liquid crystalline polyester solution with an improved solubility in a solvent, which is desirable.

For producing a liquid crystalline polyester in the present invention, a raw material for structural unit (3) is preferably used in about the same amount as of a raw material for structural unit (2). For example, the raw material for structural unit (3) is preferably used in the amount of from 0.9 times to 1.1 times as large as the amount of the raw material for structural unit (2). In this case, polymerization degree of the resulting liquid crystalline polyester can be easily controlled.

A method for producing a liquid crystalline polyester in the present invention is not limited. Examples of the method include a method in which a phenolic hydroxyl group or an amino group of an aromatic hydroxycarboxylic acid for structural unit (1), an aromatic amine and an aromatic diamine having a hydroxyl group for structural unit (3) is acylated with an excessive amount of a fatty acid anhydride to obtain an acyl compound corresponding thereto, and then transesterification (polycondensation) in melt-polycondensation of the thus-obtained acyl compound and an aromatic dicarboxylic acid for structural unit (2) is conducted. Alternatively, a fatty acid ester obtained in advance by acylation may be used as the acyl compound (see, JP-A Nos. 2002-220444 and 2002-146003).

In the acylation reaction, the fatty acid anhydride is preferably used in the amount of 1.0 to 1.2 times by mole, more preferably in the amount of 1.05 to 1.1 times by mole, on the basis of the total amount of the phenolic hydroxyl group and/or amino group to be reacted. When the amount of the fatty acid anhydride is smaller than 1.0 times, the acyl compound and the raw material monomer may sublimate at the time of the transesterification (polycondensation), and the reaction system tends to be easily blocked up. When the amount is larger than 1.2 times, coloration of the resulting liquid crystalline polyester tends to be observed.

The acylation reaction is preferably carried out at a temperature of 130 to 180° C. for five minutes to ten hours, and is more preferably carried out at a temperature of 140 to 160° C. for ten minutes to three hours.

The fatty acid anhydride used in the acylation reaction is not limited. Examples of the fatty acid anhydride include acetic anhydride, propionic anhydride, butylic anhydride, isobutylic anhydride, valeric anhydride, pivalic anhydride, 2-ethyl hexanoic anhydride, monochloroacetic anhydride, dichloroacetic anhydride, trichloroacetic anhydride, monobromoacetic anhydride, dibromoacetic anhydride, tribromoacetic anhydride, monofluoroacetic anhydride, difluoroacetic anhydride, trifluoroacetic anhydride, glutaric anhydride, maleic anhydride, succinic anhydride and β-bromopropionic anhydride. These fatty acid anhydrides may be used as the mixture of two kinds or more of them. Among these, acetic anhydride, propionic anhydride, butylic anhydride and isobutylic anhydride are preferable from the viewpoint of the price and handle-ability, and acetic anhydride is more preferable.

In the polymerization by the transesterification and the transamidation, the acyl group of the acyl compound is preferable to be 0.8 to 1.2 times by mole of carboxyl group.

The polymerization by transesterification and transamidation is preferably carried out at a temperature of 130 to 400° C. while the temperature is raised at the rate of 0.1 to 50° C./minute, and is more preferably carried out at a temperature of 150 to 350° C. while the temperature is raised at the rate of 0.3 to 5° C./minute.

When the transesterification of an acyl compound and a carboxylic acid is conducted, the fatty acid generated as a by-product and the unreacted fatty acid anhydride are preferably distilled and removed outside the reaction system by being vaporized in order to move the equilibrium.

The acylation reaction and the polymerization by transesterification and transamidation may be carried out in is the presence of a catalyst. The catalyst may be conventionally-used one. Examples of the catalyst include metal salt catalysts such as magnesium acetate, stannous acetate, tetrabutyl titanate, lead acetate, sodium acetate, potassium acetate and antimony trioxide; and organic compound catalysts such as N,N-dimethylaminopyridine and N-methylimidazole.

Among these catalysts, heterocyclic compounds containing two or more nitrogen atoms such as N,N-dimethylaminopyridine and N-methylimidazole are preferably used (see, JP-A No. 2002-146003).

The catalyst may be used together with monomers as raw materials for the acylation, and does not necessarily need to be removed after the acylation, which can be followed by polymerization by transesterification and/or transamidation to produce a liquid crystalline polyester.

Polycondensation by transesterification and/or transamidation may be melt polymerization or may be melt polymerization followed by solid-phase polymerization. The solid-phase polymerization may be conducted in a method in which a pre-polymer obtained by a melt polymerization is crushed to prepare a powder-like or flake-like pre-polymer, which is then polymerized by a solid-phase polymerization (which may be a known polymerization). Specifically, for example, such a method can be conducted in a way that heat treatment of the crushed pre-polymer is conducted in a solid-phase under the inert atmosphere such as nitrogen atmosphere at a temperature of 20 to 350° C. for 1 to 30 hours. The solid-phase polymerization may be conducted while the crushed pre-polymer is stirred, or may be conducted while leaving the crushed pre-polymer at rest without stirring. The melt polymerization and the solid-phase polymerization may be conducted in one reaction tank installed with a suitable stir means. After the solid-phase polymerization, the resulting liquid crystalline polyester may be pelletized and shaped by known methods.

The production of the liquid crystalline polyester can be conducted using, for example, a batch apparatus, a continuous apparatus and the like.

The liquid crystalline polyester may contain a filler, an additive and like provided that properties of the polyester are not impaired.

Examples of the filler include organic fillers such as epoxy resin powder, melamine resin powder, urea resin powder, benzoguanamine resin powder and styrene resin; and inorganic fillers such as silica, alumina, titanium oxide, zirconia, kaolin, calcium carbonate and calcium phosphate.

Examples of the additive include a coupling agent, an anti-setting agent, an ultraviolet absorbent and a thermostabilizer.

Moreover, the liquid crystalline polyester may contain one or more kinds of other materials provided that properties of the polyester are not impaired. Examples of such a material include a thermoplastic resin such as polypropylene, polyamide, polyester, polyphenylene sulfide, polyether ketone, polycarbonate, polyether sulfone, polyphenylether and its denatured product and polyether imide, and an elastomer such as copolymer of glycidyl methacrylate and ethylene.

The weight average molecular weight of the liquid crystalline polyester is not limited, and may be about 100,000 to 500,000.

As mentioned above, a laminate of the present invention comprises a resin layer and a copper foil. The laminate may be obtained by a method in which the above-mentioned liquid crystalline polyester is dissolved in a solvent, the resulting liquid crystalline polyester solution is applied onto a copper foil or cast onto a copper foil, the solvent is removed and then heat treatment is conducted.

Examples of the method of applying the liquid crystalline polyester solution include a roller coating method, a dip coating method, a spray coating method, a spinner coating method, a curtain coating method, a slot coating method and a screen printing method.

Examples of the solvent for preparing the liquid crystalline polyester solution in the present invention include aprotic solvents such as N,N-dimethylacetamide, N-methyl-pyrrolidone, N-methyl caprolactam, N,N-dimethylformamide, N,N-diethylformamide, N,N-diethylacetamide, N-methyl propionamide, dimethylsulfoxide, γ-butyl lactone, dimethylimidazolidinone, tetramethylphosphoric amide and ethylcellosolve acetate; and organic solvents such as halogenated phenols, for example, parachlorophenol. Among them, aprotic solvents are preferable. These solvents may be used in the mixture of two or more kinds of them.

The liquid crystalline polyester may be contained in the liquid crystalline polyester solution in the amount of 0.5 to 50% by weight, preferably in the amount of 5 to 20% by weight, and more preferably in the amount of 10 to 20% by weight, on the basis of the organic solvent.

When the amount of the liquid crystalline polyester is too small in the liquid crystalline polyester solution, the efficiency for producing the resulting laminate tends to be lowered, and when the amount is too large, the liquid crystalline polyester may be difficult to be dissolved.

It is preferred to conduct filtration of the liquid crystalline polyester solution with a filter or the like to remove minute foreign matters contained in the solution, before being applied or cast onto a copper foil.

In the liquid crystalline polyester solution, an inorganic filler may be added if necessary. While the liquid crystalline polyester solution with no inorganic filler added is preferably utilized in view of folding endurance of the resulting laminate, the crystalline polyester solution with inorganic filler may be utilized in view of dimensional stability of the resulting laminate. Examples of the inorganic filler include aluminum borate, potassium titanate, magnesium sulfate, zinc oxide, silicon carbide, silicon nitride, glass fiber and alumina fiber. In the case of using the inorganic filler, the shape of filler is not limited. The filler preferably has a shape with the average particle diameter of 1.0 μm or smaller or a shape with the average fiber diameter of 1.0 μm or smaller which may be observed by scanning electron microscope.

When the inorganic filler is added, the amount of the inorganic filler in the liquid crystalline polyester solution may be in the range of 1 to 100 parts by weight, and is preferably in the range of 1 to 40 parts by weight, on the basis of 100 parts by weight of the liquid crystalline polyester.

The liquid crystalline polyester solution in the present invention may contain two or more kinds of the inorganic fillers.

The surface of the inorganic filler may be treated with a silane coupling agent and the like to improve the compatibility and adhesive property with the liquid crystalline polyester.

Alternatively, a silane coupling agent may be added in the liquid crystalline polyester solution after adding an inorganic filler therein, followed by stirring uniformly.

Examples of the silane coupling agents include silane compounds represented by formula ($F_1$) to ($F_7$) below. The silane coupling agent preferably has a boiling point of 200° C. or higher, and more preferably has a boiling point of 250° C. or higher.

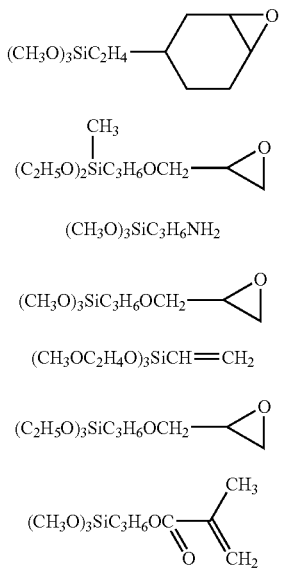

A copper foil used in the invention is a copper foil having a tensile modulus of 60 GPa or smaller and a tensile strength at break of 150 MPa or smaller measured after heat treatment at a temperature of 300° C. Also, the copper foil is a copper foil having a tensile modulus of 10 GPa or larger (preferably 20 GPa or larger) and a tensile strength at break of 20 MPa or larger (preferably 30 GPa or larger) measured after heat treatment at a temperature of 300° C.

The copper foil may be a so-called high-temperature-elongation copper foil (hereinafter, referred to as "HTE copper foil"). Also, the copper foil may be commercially available one (which may be a rolled copper foil) provided that the copper foil has a tensile modulus of 60 GPa or smaller and a tensile strength at break of 150 MPa or smaller measured after heat treatment at a temperature of 300° C. The tensile modulus and tensile strength at break can be measured by the method of JIS C2151.

The thickness of the copper foil in the present invention is preferably larger than 5 μm, but 35 μm or smaller, and is more preferable in the range of from 9 to 18 μm. When the copper foil is in the above-mentioned range, the tension of the copper foil can be adjusted easily in producing a laminate having the copper foil, which results in an improved flexibility of the resulting laminate.

Moreover, the value obtained by dividing the thickness of the layer of the liquid crystalline polyester by the thickness of the copper foil is preferably in the range of 0.5 to 20, and more preferably in the range of 0.7 to 20.

Examples of preferable copper foil that can be used in the present invention include SQ-HTE copper foil (manufactured by Mitsui Mining & Smelting Co., Ltd.), 3EC-M3S-HTE copper foil (manufactured by Mitsui Mining & Smelting Co., Ltd.), NS-HTE copper foil (manufactured by Mitsui Mining & Smelting Co., Ltd.), 3EC-HTE copper foil (manufactured by Mitsui Mining & Smelting Co., Ltd.), F2-WS copper foil (manufactured by Furukawa Circuit Foil Co., Ltd.), HLB (manufactured by Nippon Denkai Ltd.), CF-T4X-DS-SVR (manufactured by Fukuda Metal Foil & Powder Co., Ltd.), RCF-T5B-HPC (manufactured by Fukuda Metal foil & Powder Co., Ltd.), BHY-22B-T (manufactured by Nikko Materials Co., Ltd.), and BHY-22B-HA (manufactured by Nikko Materials Co., Ltd.). These are easily commercially available copper foils.

Handling and tensile strength relaxation properties of copper foil at the time of producing the laminate become good due to the copper foil having the above-mentioned properties. Moreover, the laminate in the present invention is excellent in adhesion between the copper foil and the liquid crystalline polyester layer and has good flexibility and durability in folding.

As described above, a laminate of the present invention may be produced by a method in which a liquid crystalline polyester solution is applied onto a copper foil or cast onto a copper foil, and the solvent is removed, and then heat treatment is conducted. The removal of the solvent is preferably conducted by the evaporation of the solvent. Examples of the evaporating of the solvent include heating under reducing pressure, ventilating and the like. The temperature for the evaporation is preferably in the range of 80 to 200° C. The evaporation may be conduct for 10 to 120 minutes.

The heat treatment after the removal of the solvent may be carried out at a temperature of 250 to 350° C. The heat treatment may be conducted for 10 hours or shorter, preferably for 3 hours or shorter. The heat treatment is preferably performed under the atmosphere of an inert gas such as nitrogen atmosphere.

The laminate of the present invention has a liquid crystalline polyester resin layer with one or two copper foil layers on one side or both sides of the resin layer.

Thus obtained liquid crystalline polyester copper-clad laminate in the present invention becomes good in flexibility and can endure the use of high frequency. The laminate can be suitably used for multiplayer printed boards, flexible printed wiring boards and film for tape automated bonding for a semiconductor package and a mother board, which are obtained by the buildup method, because of its excellent characteristic of high thermal resistance, low hygroscopicity and the like.

The invention being thus described, it will be apparent that the same may be varied in many ways. Such variations are to be regarded as within the spirit and scope of the invention, and all such modifications as would be apparent to one skilled in the art are intended to be within the scope of the following claims.

The entire disclosure of the Japanese Patent Application No. 2005-220341 filed on Jul. 29, 2005 and the Japanese Patent Application No. 2005-266646 filed on Sep. 14, 2005, both indicating specification, claims and summary, are incorporated herein by reference in their entirety.

EXAMPLES

The present invention is described in more detail by following Examples, which should not be construed as a limitation upon the scope of the present invention.

Example 1

In a reactor equipped with a stirring device, a torque meter, a nitrogen-introducing tube, a thermometer, and a reflux condenser, 941 g (5.0 mole) of 2-hydroxy-6-naphthoic acid, 273 g (2.5 mole) of 4-aminophenol, 415.3 g (2.5 mole) of isophthalic acid, and 1123 g (11 mole) of acetic anhydride were put in. After the reactor inside was substituted enough with nitrogen gas, the temperature within the reactor was raised to a temperature of 150° C. over 15 minutes under the flow of nitrogen gas and the liquid within the reactor was refluxed for three hours while the temperature was maintained.

After that, the temperature was raised to a temperature of 320° C. over 170 minutes while distilling by-product acetic acid and unreacted acetic anhydride to be removed. When the rise of the torque was admitted, the reaction was considered to end, and the content was taken out to obtain a liquid crystalline polyester resin. After the liquid crystalline polyester resin was crushed with a coarse crusher, a part of the resin (particles) was observed with a polarizing microscope while heating at the rate of 10° C./minute. As a result, schlieren pattern was observed at a temperature of 200° C. The pattern is peculiar to the liquid crystalline phase.

The liquid crystalline polyester powder obtained above was maintained at 250° C. for three hours under the nitrogen atmosphere to advance polymerization reaction in the solid phase. After that, 8 g of the resulting liquid crystalline polyester powder was added in 92 g of N-methyl-2-pyrrolidone and was heated to a temperature of 160° C. to obtain a completely dissolved, brown transparent solution. This solution was stirred and defoamed to obtain a liquid crystalline polyester solution.

Into the liquid crystalline polyester solution, aluminum borate (Alborex M20C: manufactured by Shikoku Chemicals Corporation, specific gravity is 3.0 g/cm$^3$) was added in an amount of 19.6% by weight to the liquid crystalline polyester and dispersed and defoamed to obtain a dispersion liquid. After that, the liquid was cast onto an electrolytic copper foil with a surface roughness of 2.1 μm (manufactured by Mitsui Mining & Smelting Co., Ltd.; 3EC-M3S-THE; thickness of 18 μm) using a film applicator, was dried with a hot plate at a temperature of 80° C. for one hour, was then again heated from 30° C. to 300 ° C. at the rate of 5° C./minute in the hot-air oven under the nitrogen atmosphere and was maintained at a temperature of 300 ° C. for one hour to conduct heat treatment. After the temperature was returned to room temperature, a laminate of the liquid crystalline polyester resin layer and the copper foil was obtained. The liquid crystalline polyester resin layer had a thickness of 25 μm. The flexibility of the laminate was measured by the method of JIS C6471 (R=0.38, 4.9 N).

A peel test piece of 10 mm in width was cut off from the obtained laminate, and the anisotropy of the machine direction (MD) and the transverse direction (TD) in the laminate was evaluated by measuring the 90° peel strength at the peeling speed of 50 mm/minute.

On the other hand, the tensile modulus and the tensile strength at break of the copper foil used were evaluated before and after the heat treatment, by the method of JIS C2151, using Autograph AG-5000D (manufactured by Shimadzu Corporation).

Before the heat treatment, the copper foil had a tensile modulus of 66 GPa and a tensile strength at break of 405 MPa. After the heat treatment at 300° C. for one hour under the nitrogen atmosphere, the copper foil had a tensile modulus of 43 GPa and a tensile strength at break of 54 MPa. The speed in the tensile strength tester was 5 mm/min. These results are shown in Table 1.

Example 2

A laminate was obtained in the same method as in Example 1 except that an electrolytic copper foil with a surface roughness of 2.1 μm (manufactured by Furukawa Circuit Foil Co., Ltd.; F2-WS; thickness of 18 μm) was used. The laminate was evaluated in the same way as above. The liquid crystalline polyester resin layer had a thickness of 25 μm. The results are shown in Table 1.

Example 3

A laminate was obtained in the same method as in Example 1 except that an electrolytic copper foil with a surface roughness of 1.4 pin (manufactured by Nippon Denkai Ltd.; HLB; thickness of 18 μm) was used. The liquid crystalline polyester resin layer had a thickness of 25 μm. The results are shown in Table 1.

Example 4

A laminate was obtained in the same method as in Example 1 except that a rolled copper foil with a surface roughness of 3.6 μm (manufactured by Fukuda Metal Foil & Powder Co., Ltd.; RCF-T5B-HPC; thickness of 18 μm) was used. The liquid crystalline polyester resin layer had a thickness of 25 μm. The results are shown in Table 1.

Example 5

A laminate was obtained in the same method as in Example 1 except that a rolled copper foil with a surface roughness of 0.7 μm (manufactured by Nikko Materials Co., Ltd.; BHY-22 B-T; thickness of 18 μm) was used. The liquid crystalline polyester resin layer had a thickness of 25 μm. The results are shown in Table 1.

Example 6

A laminate was obtained in the same method as in Example 2 except that the aluminum borate as an inorganic filler was not added. The liquid crystalline polyester resin layer had a thickness of 13 μm. The results are shown in Table 1.

Example 7

A laminate was obtained in the same method as in Example 3 except that the aluminum borate as an inorganic filler was not added. The liquid crystalline polyester resin layer had a thickness of 13 μm. The results are shown in Table 1.

Example 8

A laminate was obtained in the same method as in Example 4 except that the aluminum borate as an inorganic filler was not added. The liquid crystalline polyester resin layer had a thickness of 13 μm. The results are shown in Table 1.

Example 9

A laminate was obtained in the same method as in Example 5 except that the aluminum borate as an inorganic filler was not added. The liquid crystalline polyester resin layer had a thickness of 13 μm. The results are shown in Table 1.

Comparative Example 1

A laminate was obtained in the same method as in Example 1 except that an electrolytic copper foil with a surface roughness of 2.5 μm (manufactured by Mitsui Mining & Smelting Co., Ltd.; SQ-VLP; thickness of 18 μm) was used. The liquid crystalline polyester resin layer had a thickness of 25 μm. The results are shown in Table 1.

TABLE 1

| | Kinds of copper foil | Tensile modulus [GPa] Before the heat treatment/After the treatment of 300° C. for one hour | tensile strength at break [MPa] Before the heat treatment/After the treatment of 300° C. for one hour | 90° copper foil peel strength [N/cm] MD/TD | Bending frequency [Times] |
|---|---|---|---|---|---|
| Example 1 | 3EC-M3S-HTE | 66/43 | 405/54 | 9/9 | 164 |
| Example 2 | F2-WS | 82/59 | 147/119 | 10/10 | 186 |
| Example 3 | HLB-18 | 59/32 | 508/58 | 8/8 | 184 |
| Example 4 | RCF-T5B-HPC | 73/23 | 408/62 | 8/8 | 167 |
| Example 5 | BHY-22B-T | 79/34 | 437/62 | 8/8 | 202 |
| Example 6 | F2-WS | 82/59 | 147/119 | 17/17 | 366 |
| Example 7 | HLB-18 | 59/32 | 508/58 | 17/17 | 550 |
| Example 8 | RCF-T5B-HPC | 73/23 | 408/62 | 15/15 | 535 |
| Example 9 | BHY-22B-T | 79/34 | 437/62 | 11/11 | 454 |
| Comparative example 1 | SQ-VLP | 74/77 | 497/371 | 10/10 | 85 |

As shown in Table 1, no anisotropic problem was seen in any film. In Examples 1 to 5, the bending frequency was 160 times or more, which shows good flexibility. On the other hand, in Comparative example 1, the bending frequency was small with 85 times.

What is claimed is:

1. A laminate comprising a resin layer and a copper foil, wherein
the resin layer is a layer of a liquid crystalline polyester having at least one structural unit selected from the group consisting of a structural unit derived from aromatic diamine and a structural unit derived from aromatic amine with a phenolic hydroxyl group in an amount of 10 to 35% by mole on the basis of the total structural units in the polyester, and
the copper foil, after being heat treated at a temperature of 300° C. for one hour, has a tensile modulus of 60 GPa or smaller and a tensile strength at break of 150 MPa or smaller, and the tensile modulus of the foil measured after the heat treatment is lower than that measured without the heat treatment.

2. The laminate according to claim 1, wherein the liquid crystalline polyester has the structural units represented by formulas (1), (2) and (3) below, and the amounts of the structural units represented by the formula (1), (2) and (3) are 30 to 80% by mole, 10 to 35% by mole and 10 to 35% by mole on the basis of the total structural units in the polyester, respectively;

—O—Ar$_1$—CO— (1)

—CO—Ar$_2$—CO— (2)

—X—Ar$_3$—Y— (3)

where Ar$_1$ indicates phenylene, naphtylene or biphenylene, Ar$_2$ indicates phenylene, naphtylene, biphenylene, oxybiphenylene or a condensed aromatic ring, Ar$_3$ indicates phenylene or a condensed aromatic ring, X indicates —NH— and Y indicates —O— or —NH—.

3. The laminate according to claim 2, wherein the structural unit represented by formula (1) is at least one unit selected from the group consisting of structural units derived from p-hydroxybenzoic acid, 2-hydroxy-6-naphthoic acid and 4-hydroxy-4'-diphenylcarboxylic acid; the structural unit represented by formula (2) is at least one unit selected from the group consisting of structural units derived from terephthalic acid, isophthalic acid, 2,6-naphthalenedicarboxylic acid and diphenylether-4,4'-dicarboxylic acid; and the structural unit represented by formula (3) is at least one unit selected from the group consisting of structural units derived from 3-aminophenol, 4-aminophenol, 1,4-phenylenediamine and 1,3-phenylenediamine.

4. The laminate according to claim 3, wherein the structural unit represented by formula (1) is a structural unit derived from 2-hydroxy-6-naphthoic acid, the structural unit represented by formula (2) is a structural unit derived from isophthalic acid and the structural unit represented by formula (3) is a structural unit derived from 4-aminophenol.

5. A method for producing a laminate comprising a resin layer and a copper foil, the method comprising the steps of:
(i) applying or casting on a copper foil a liquid crystalline polyester solution obtained by dissolving in a solvent a liquid crystalline polyester having at least one structural unit selected from the group consisting of a structural unit derived from aromatic diamine and a structural unit derived from aromatic amine with a phenolic hydroxyl group in an amount of 10 to 35% by mole on the basis of the total structural units in the polyester;
(ii) removing the solvent; and
(iii) heating the copper foil with the liquid crystalline polyester at a temperature of from 250° C. to 350° C., wherein the copper foil, after being heat treated at a temperature of 300° C. for one hour, has a tensile modulus of 60 GPa or smaller and a tensile strength at break of 150 MPa or smaller.

6. The method according to claim 5, wherein the solvent is an aprotic solvent.

* * * * *